US006587914B2

(12) United States Patent
Campardo

(10) Patent No.: US 6,587,914 B2
(45) Date of Patent: *Jul. 1, 2003

(54) NON-VOLATILE MEMORY CAPABLE OF AUTONOMOUSLY EXECUTING A PROGRAM

(75) Inventor: Giovanni Campardo, Bergamo (IT)

(73) Assignee: STMicroelectronics S.r.l., Agrate Brianza (IT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/349,702

(22) Filed: Jul. 8, 1999

(65) Prior Publication Data

US 2002/0007434 A1 Jan. 17, 2002

(30) Foreign Application Priority Data

Jul. 9, 1998 (IT) .......................................... MI98A1564

(51) Int. Cl.[7] .............................................. G06F 12/00
(52) U.S. Cl. .......................... 711/103; 712/14; 712/229; 712/220
(58) Field of Search .............................. 711/1, 170, 103, 711/115; 712/14, 220, 221, 223, 225, 229; 365/185.25

(56) References Cited

U.S. PATENT DOCUMENTS

| 5,165,023 A | | 11/1992 | Gifford ........................ 395/325 |
| 5,325,500 A | | 6/1994 | Bell et al. .................... 395/425 |
| 5,396,641 A | * | 3/1995 | Iobst et al. |
| 5,491,665 A | * | 2/1996 | Sachdev ...................... 365/201 |
| 5,523,981 A | | 6/1996 | Yamaguchi et al. ......... 365/233 |
| 5,546,343 A | | 8/1996 | Elliott et al. ............ 365/189.04 |
| 5,598,372 A | | 1/1997 | Matsumoto et al. ..... 365/230.01 |
| 5,627,989 A | * | 5/1997 | Nakamura et al. .......... 711/103 |
| 5,678,021 A | * | 10/1997 | Pawate et al. ............... 711/104 |
| 5,719,807 A | * | 2/1998 | Sali et al. ............... 365/185.25 |
| 5,844,843 A | * | 12/1998 | Matsubara et al. ..... 365/185.24 |
| 6,023,761 A | * | 2/2000 | Ott ................................. 713/1 |
| 6,026,478 A | * | 2/2000 | Dowling ...................... 712/24 |
| 6,064,593 A | * | 5/2000 | Matsubara et al. ..... 365/185.11 |
| 6,141,705 A | * | 10/2000 | Anand et al. ................. 710/15 |
| 6,185,704 B1 | * | 2/2001 | Pawate et al. ............... 714/719 |

OTHER PUBLICATIONS

IT 1267610B (Bracco) (Feb. 1997) teaches super memory ring type universal electronic memorizing and processing device superior to a microprocessor, multiprocessors and sequential machines.*

(List continued on next page.)

Primary Examiner—Matthew Kim
Assistant Examiner—Pierre-Michel Bataille
(74) Attorney, Agent, or Firm—Lisa K. Jorgenson; E. Russell Tarleton; Seed IP Law Group PLLC

(57) ABSTRACT

A non-volatile semiconductor memory device that includes an address buffer block, a matrix of memory cells, and an output buffer block. The address buffer block receives input signals external to the memory device, that in a first operating mode are controlled by devices outside to the memory device, and transmit signals to the matrix of memory cells, which are adapted to decode the received signals and to transmit in turn output decoded signals through the output buffer block. A command block is provided that is activatable through an external control signal and once activated, it puts the memory device in a second operating mode in which the command block receives at least a part of the signals in output of said matrix of memory cells and, after having processed them, transmits internal address signals to the address buffer block. This provides a feedback inside the memory device capable of making the same able to autonomously execute a succession of instructions stored in the matrix of memory cells.

18 Claims, 4 Drawing Sheets

OTHER PUBLICATIONS

D. Elliott et al., Computational RAM: A Memory–SIMD Hybrid and its Application to DSP, Proceeding of the Custom ntegrated Circuits Conference, Jan. 1992.*

P. Kooge et al., Combined DRAM and Logic Chip for Massively Parallel Systems, Proceedings on Advanced Research in VLSI, pp. 4–16, 1995.*

O. Daescu et al., Parallel Content–Based Image Analysis on PIM Processors, IEEE Workshop and Proceedings on Content–Based Access of Image and Video Libraries, pp. 73–77, Jun. 1998.*

Sterling, T et al. New Approaches to Spaceborne Computing, IEEE Aerospace Conference, pp. 23–32, Mar. 1998.*

* cited by examiner

| C1 | C2 | C3 | C4 | O0 | O1 | O2 | O3 | O4 | O5 | O6 | O7 | O8 | O9 | O10 | O11 | O12 | O13 | O14 | O15 | ck0 | ck1 | ck2 | ck3 | ck4 | ck5 | ck6 | ck7 | ck8 | ck9 | ck10 | ck11 |
|---|---|---|---|---|---|---|---|---|---|---|---|---|---|---|---|---|---|---|---|---|---|---|---|---|---|---|---|---|---|---|---|
| | | | | r1 | r2 | r3 | r4 | in0 | in1 | in2 | in3 | in4 | in5 | in6 | in7 | in8 | in9 | in10 | in11 | in12 | in13 | in14 | in15 | in16 | in17 | in18 | | | | | |
| | | | | S | A0 | A1 | A2 | A3 | A4 | A5 | A6 | A7 | A8 | A9 | A10 | A11 | A12 | A13 | A14 | A15 | A16 | A17 | A18 | | | | | | | | |

NON-VOLATILE MEMORY CAPABLE OF AUTONOMOUSLY EXECUTING A PROGRAM

TECHNICAL FIELD

The present invention relates to a non-volatile memory capable of executing a program independently from a microprocessor.

BACKGROUND OF THE INVENTION

The families of the non-volatile memories, among which are the EEPROMs and the Flash EEPROM, share a fundamental property: They all effect a conversion of binary codes. Such conversion is performed by decoding the code that is introduced in input, getting a number of distinct signal lines, resulting from all the possible combinations of the bits of the input code; these lines are then encoded in the desired output word through a circuit called an encoder. The memory matrix produces therefore the desired functional relationship between input and output.

From this point of view it is reasonable to classify a non-volatile matrix as a combinatorial circuit, not as a sequential circuit because the outputs depend entirely from the actual inputs and not from the preceding history of the circuit. What is stored is the functional relationship between inputs and outputs.

In the electronic devices comprising microcomputers, that is computers in which a microprocessor is present, the non-volatile memory is used to store the program that must be performed by the microprocessor.

The microprocessor is an integrated circuit that contains a control unit and an arithmetic-logic unit and has an internal state that is usually controllable from the outside through a programmable fixed memory.

The microprocessor is a very complex unit, capable of performing programs involving operations of calculation, of comparison of data, of timing and other usually essential operations in the actual electronic devices.

The structure of a microcomputer essentially consists of a central processing unit (microprocessor), a memory, and input/output devices. The program that must be performed by the microprocessor is stored in a non-volatile memory. During operation the microprocessor extracts the instructions from the memory, performing them in succession and elaborating therefore the data according to the program. During elaboration the results of the same can be provided to the outside through the output devices. The memory has therefore the purpose to preserve the program, i.e., the instructions and the data necessary to the operation of the microprocessor.

In FIG. 1 there is schematically represented a block diagram of a microcomputer in which a non-volatile memory 1 is present that contains the control program of the system, a microprocessor 2, a RAM memory 3 that temporarily stores instructions and data, these last written in memory locations each one having a respective address. Also present is an input/output I/O unit 4 that receives signals 5 of input and output. The various elements are connected by a data bus 6, bidirectionally carrying the data among the different sections of the microcomputer, and by an address and control bus 7, unidirectional and adapted to transmit the address of the memory location which is desired to be read or written, or of the input or output device that must be activated, and to carry the control signals necessary for example to enable the memory to operate in reading or writing or to enable the circuits of input-output interface.

In FIG. 2 the functional structure of the non-volatile memory 1 of FIG. 1 is schematically shown. The input signals 8, comprising control and address signals, are sent through input buffers 10 to a matrix of memory cells 11 that decodes them and sends respective coded signals 9 to output buffers 12 connected to the data bus 6.

The elements shown in FIG. 2 are present in any non-volatile memory and they constitute the fundamental structure thereof, even if other functional blocks are generally foreseen, such as for instance circuits of control or verification.

In several applications, the power of calculation, essential for instance in a computer, is not necessary and the execution of a program is reduced to the simple execution in sequential way of the instructions contained in the memory. For instance, the distributors of drinks perform a sequential program, which uses in reality few instructions, performing only a series of timed operations that, in principle, do not require the use of a microprocessor. Other examples are found in appliances such as dishwashers, washing machines or refrigerators, which perform some identical cycles in time that need not a great flexibility.

SUMMARY OF THE INVENTION

The present invention provides a non-volatile memory configured to behave as a RISC (Reduced Instruction Set Computer) machine, performing a limited set of instructions that substantially make the non-volatile memory a sequential machine. This additional intelligence of the non-volatile memory does not pose it at the same level of a microcontroller; however, it could allow the memory itself to perform some simple tasks, leaving more difficult tasks to the microprocessor.

Additionally, such memory would, if the particular application makes it possible, avoid the use of a microprocessor with a significant reduction of costs.

The present invention provides a non-volatile memory semiconductor device having an address buffer block, a matrix of memory cells, and an output buffer block, the address buffer block receiving input signals external to the memory device, that in a first operating condition are controlled by devices external to the memory device, and transmitting signals to the matrix of memory cells, adapted to decode the received signals and to transmit in turn decoded signals in output through the output buffer block. Further included is a command block, activatable by an external control signal that, once activated, sets the memory device in a second operating condition in which the command block receives at least a part of the signals in output from the matrix of memory cells and, after having processed them, transmits internal address signals to the address buffer block to get a feedback inside the memory device suitable for making the memory device able to perform a succession of instructions memorized in the matrix of memory cells autonomously.

BRIEF DESCRIPTION OF THE DRAWINGS

The features and advantages of the present invention will be evident from the following detailed description of one embodiment thereof, illustrated by way of a non-limiting example in the annexed drawings, wherein:

FIG. 5 shows in a chart the bits used for the execution of the code in an example of active mode of the memory; and FIG. 6 shows in a chart a sample set of instructions according to the bits of FIG. 5.

DETAILED DESCRIPTION OF THE INVENTION

Figure 1:
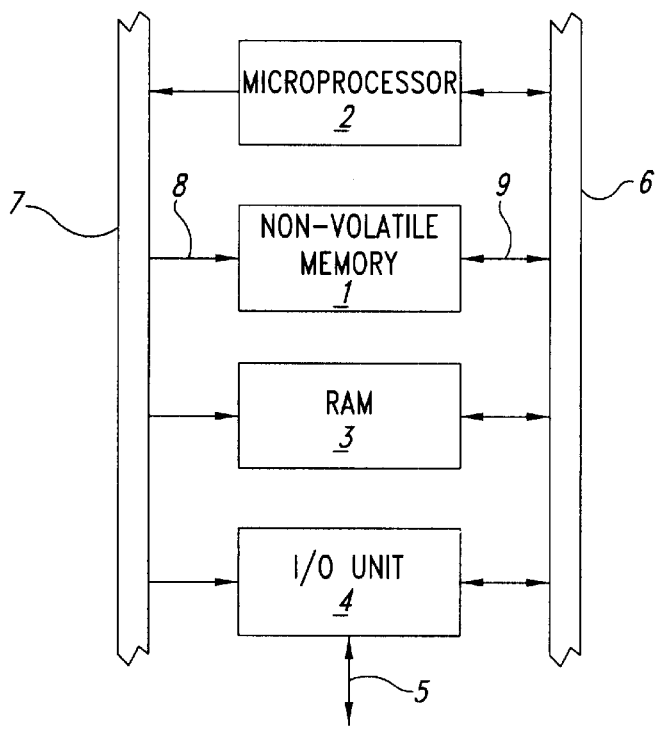
FIG. 1 schematically shows a block diagram of a microcomputer.
Figure 2:
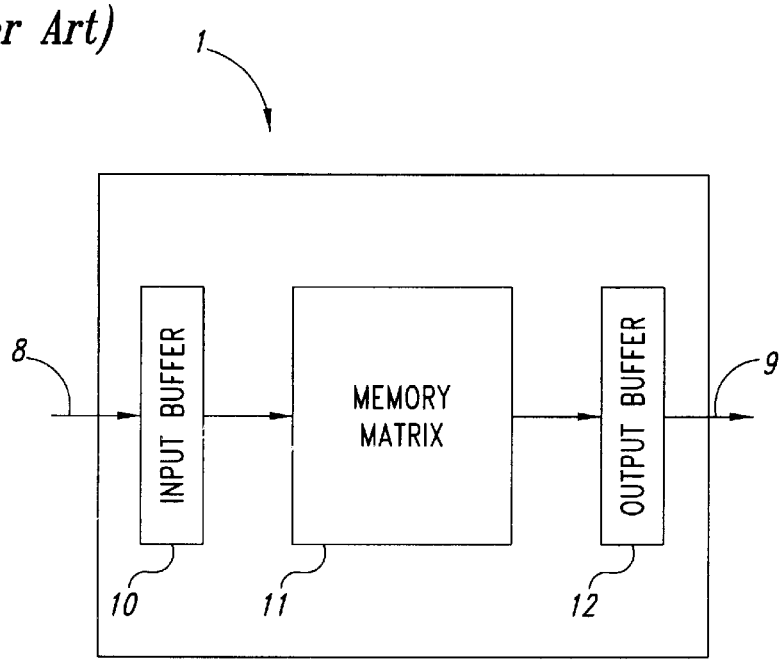
FIG. 2 schematically shows the functional structure of a non-volatile memory.
Figure 3:
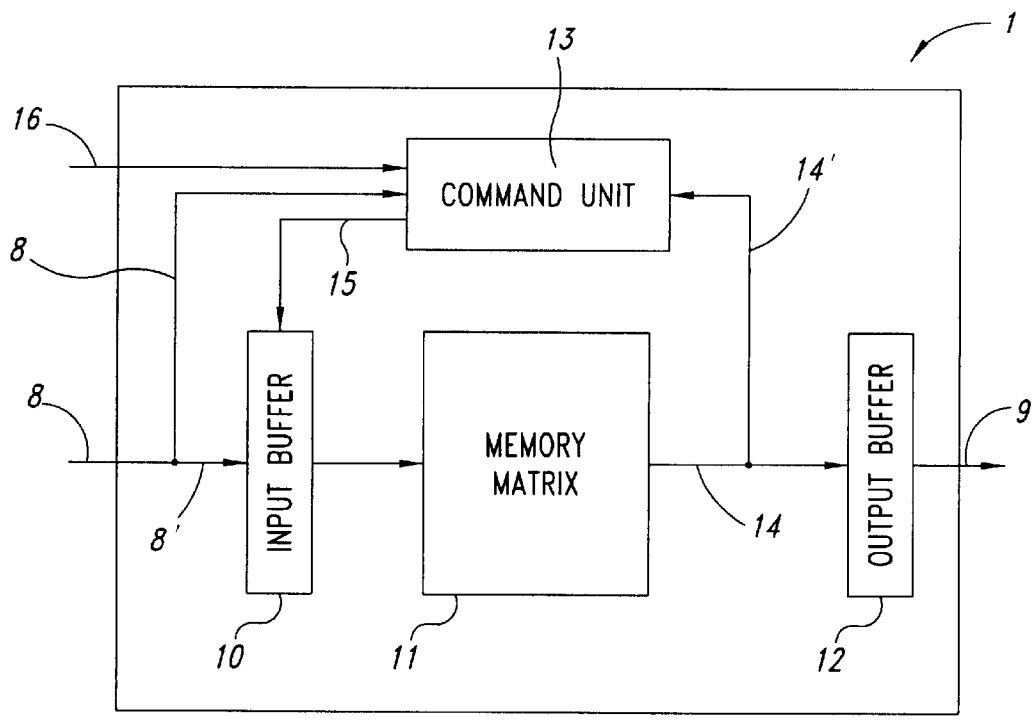
FIG. 3 schematically shows an embodiment of a block diagram functional structure of a non-volatile memory according to the present invention.

In FIG. 3 a functional structure of the non-volatile memory 1 of FIG. 1 is schematically shown, modified according to the present invention. Reference numeral 8 denotes a set of signal lines comprising address signals 8' and generic control signals. The address signals 8, through an input buffer 10, are sent to the matrix 11. With 11 a matrix of cells of memory is schematically indicated, as well as circuits for addressing the cells and for reading the same. The matrix 11 furnishes in output a set of signals 14 that carry a code depending on the current code on the address signals 8'. At least a portion 14' of the output signals 14 from the matrix 11 are directed to a command unit 13, that generally comprises a command interpreter, a program counter and an internal timer, so that the command unit processes them and therefore transmits a set of signals 15 to the address buffers 10. In this way a feedback is obtained in the memory device that makes it autonomous and capable of performing a predefined set of instructions stored in the matrix 11. The input signals 8 are also supplied, all or partly, directly to the command block 13, for driving and controlling the same, and additionally external signals 16 can also be supplied directly feeding block 13.

To realize this type of functionality of the memory, it is for instance necessary that an external control pin is activated, the external control pin being included in the external signals 16, so to switch the memory from the "passive" operating mode, in which the memory depends on the microprocessor, to an "active" operating mode in which the memory is autonomous.

Figure 4:
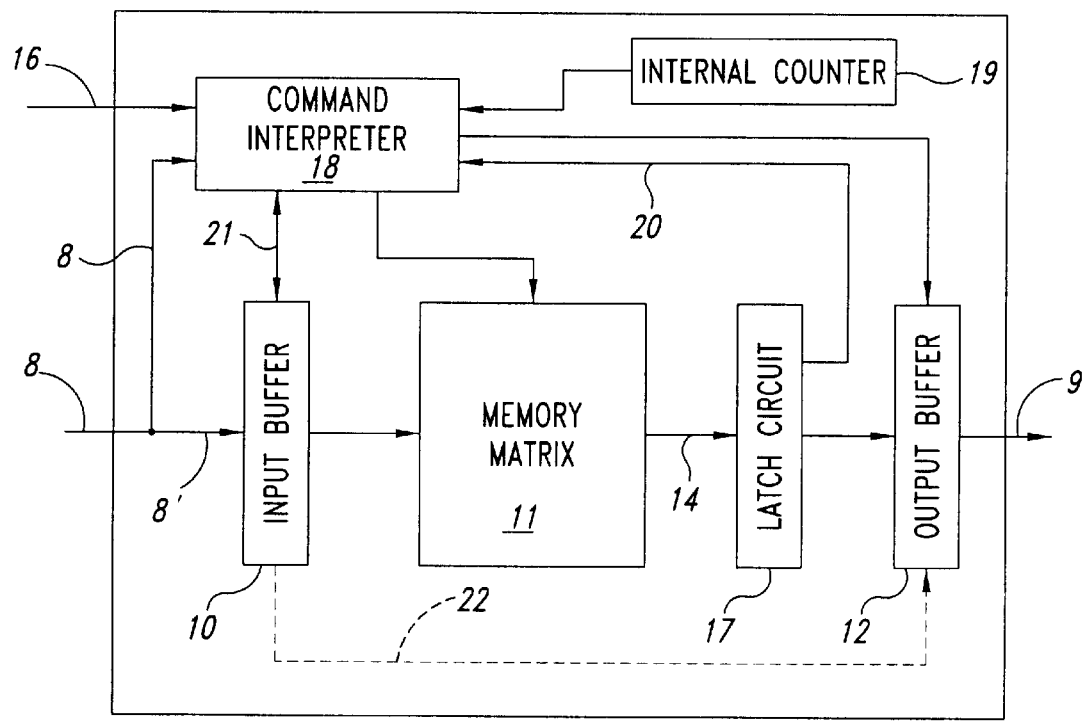
FIG. 4 shows a functional structure of the non-volatile memory of FIG. 3, expanded in some parts thereof.

In FIG. 4 a functional block diagram similar to that of FIG. 3 is depicted, showing a Flash-type non-volatile memory, in which already existing elements are used to form the command block 13 of FIG. 3.

Particularly, between the matrix 11 and the outputs buffers 12 a latch circuit 17 is provided that temporarily stores the outputs of the matrix 11 and, during the active operating mode of the memory, transmits such outputs, through a feedback line 20, to a command interpreter 18 (CUI), connected to all the units present in the memory; the command interpreter processes the aforesaid signals 20, working as a microprocessor, and sends suitable commands 21 to the address buffers 10, so to have an active feedback of the whole circuit, and to make the memory perform a prescribed determined instruction, the memory working as a sequential machine.

The CUI 18 also receives input signals 8 and external control signals 16, among which a control signal for activating the active operating mode and a clock signal, and it interacts with an internal counter 19 that can be used for keeping track of the performed operations and for calculating the correct memory address of the following instruction that must be executed, when the current one has been completed.

The outputs 9 of the memory can drive, through multiplexers, possible actuators, without the necessity of passing the outputs 9 through a microprocessor.

In FIG. 4 the possibility is also shown of providing a direct connection 22 among the address buffers 10 and the output buffers 12, so that a microprocessor can use the Flash memory as an expanded I/O connection device, directly sending the inputs to the outputs and so exploiting the output buffers 12 of the memory as drivers of signal lines.

Once the external driving pin is activated, the memory switches to the active operating mode and signals 14 at the output of the matrix 11, that in this particular example constitute a set of 16 lines, are stored by the latch circuit 17, so that they are transmitted to the CUI 18 and act as program instructions to be executed. In the case the CUI 18 processes codes of 32 bits, as supposed in this particular example, the latch circuit 17 stores the 16 bits at the output of the matrix 11 in two following cycles, so to provide to the CUI 18 a microinstruction with a suitable number of bits. Obviously the use of microinstructions formed by any number of bits can be envisaged, providing suitable latch circuits capable of storing such codes in more subsequent cycles before transmitting them to the CUI 18 for the processing.

The CUI 18 processes such code and sends suitable internal address signals to the address buffers 10 and from these to the matrix 11, that decodes them and puts on the output lines 14 a corresponding code. Such code can be transferred, through the outputs buffers 12, to the output signals 9, for instance to drive possible external actuators without passing through a microprocessor. In alternative, such code can be interpreted by the CUI 18 as a new microinstruction.

In the chart of FIG. 5 there are shown the bits used by the CUI 18 for the execution of the code, in an example in which the memory is put in active operating mode to autonomously execute a program. The single bits have the following meaning:

C1–C4: the first four bits are dedicated to identify the type of instruction; four bits mean sixteen possible executable instructions and these bits cannot take different meanings in the different instructions;

O0–O15: they are sixteen bits of the microinstruction that contain the datum to load on the sixteen outputs 9 in particular types of instruction, each output assuming the same value of the corresponding bit;

ck0–ck11: they represent the value, binary coded, selected for a timing; such value, multiplied for the period of the clock signal furnished by the outside, determines a wait time varying between 1 and 4096 times the period of external clock signal (for example, for a wait time equal to 4096 times such period, all the bits ck will be set to "1");

r1–r4: they are the coded expression of the sixteen outputs, when it is desired to address just one of it;

in0–in18: they are the 19 bits of the microinstruction elaborated by the CUI 18 that, in some types of microinstruction, assume the meaning of code of comparison with the address signals 8' coming from the outside of the memory;

S: it is a bit that allows to decide if the selected configuration is active at "1" or at "0";

A0–A18: they are the 19 bits of the microinstruction that, in some types of microinstruction, assume the meaning of a new address to furnish to the memory matrix 11 to fetch the next microinstruction.

Figure 6:
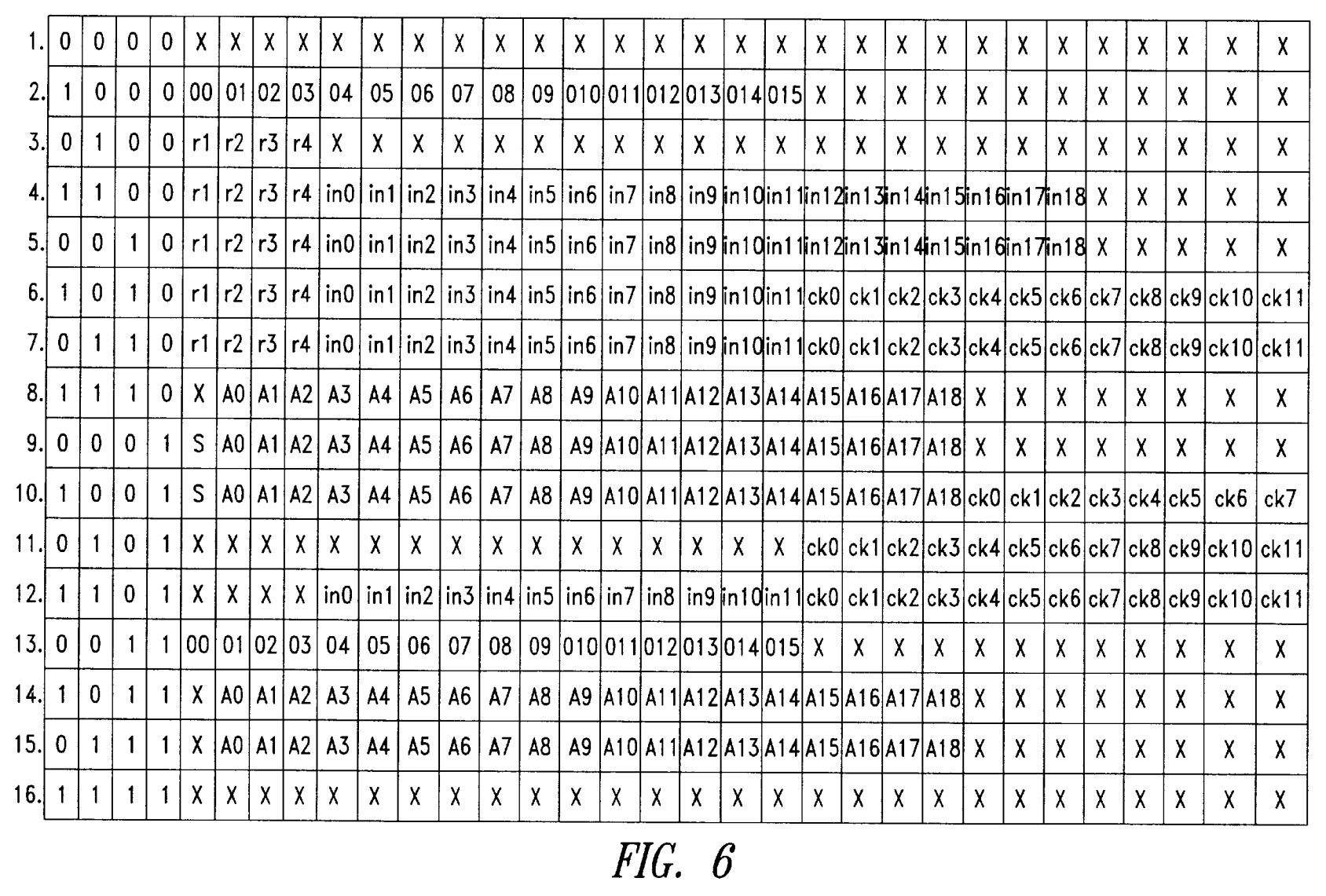

In the chart of FIG. 6 there is shown a possible set of instructions according to the bits of the chart of FIG. 5 (X denotes a non influential bit), and each one of the sixteen instructions has the following meaning:

1. It is the instruction NOP, it doesn't perform anything;
2. the sixteen outputs 9 are loaded with the assigned value, specified in the microinstruction, i.e., O0–O15;
3. the only output correspondent to the binary value of r1–r4 of the sixteen outputs 9 is loaded;
4. the only output correspondent to the expression of r1–r4 is loaded, but only when, externally to the memory the external address signal 8' corresponding to the bit that, among the bits in0–in18 of the microinstruction, is set to "1", is set to "1"; for instance if in7="1", the loading of the output 9 correspondent to the binary value of r1–r4 takes only place when the eighth bit of the external address signal 8' is set to "1"; if more than one among the bits in0–in18 of the microinstruction result to "1", the loading of the encoded output in r1–r4 occurs only when the logical OR operator of the correspondent external address signals 8' is satisfied;
5. this is an instruction identical to the preceding one except for the fact that the operator logical AND of the external address signals 8' must be satisfied, when more bits in0–in18 of the microinstruction are set to "1";
6. the only output given by r1–r4 is loaded when externally to the memory an address signal is set to "1" that corresponds to that, among the bits in0–in11 of the microinstruction, that is set to "1", or at the expiration of a timing set through the value specified in the bits ck0–ck11 of the microinstruction (if more than one among the bits in0–in11 are to "1" the OR of the correspondents address signals 8' must be satisfied);
7. it is an instruction identical to the preceding one except for the fact that the logical AND operator of the address signals 8' must be satisfied, when more bits in0–in11 of the microinstruction are set to "1";
8. it is an instruction of unconditional jump: the program is directed to the address given by the bits A0–A18 of the microinstruction;
9. the program is directed to the address given by A0–A18 at the arrival of a logical signal on an external pin, with S it is possible to choose if the logical signal on the external pin will be active in the low or high state;
10. the program is directed to the address given by A0–A18 at the arrival of a logical signal on an external pin, with S it is possible to choose if the logical signal on the external pin will be active in the low or high state, or because a timing set through the bits ck0–ck7 of the microinstruction has expired;
11. it is an instruction of wait: the program jumps to the following address at the expiring of a timing set through the bits ck0–ck11;
12. as the preceding one, this one is an instruction of wait: the program jumps to the following address at the expiring of a timing set through the bits ck0–ck11 or because the address signal 8' indicated by the bits in0–in11, or the AND of the indicated address signals, has arrived;
13. a data string is sent, specified in the bits O0–O15 of the microinstruction, synchronously with the clock signal, on an external pin (useful, for instance, for the connection to a display); this operation is performed independently from the following ones and, to every hit of clock, a single bit O0, O1 . . . O15 is transmitted;
14. the address specified by the bits A0–A18 is loaded into a possible RAM register or in a battery of latches to be added to the memory;
15. the address defined by the bits A0–A18 is fetched from the RAM register, such address becoming the following one to be executed; and
16. it is the END instruction, that stops the program and the Flash memory returns in the passive operating mode or points to a preset address that contains a program of wait.

Other codes that can result are, for example, a command that can make the Flash memory become an I/O expander so that the microprocessor uses the Flash only as a set of output buffers; another interesting command could allow the microprocessor to load the RAM register with the instructions 14 and 15, interrupting the program of the Flash memory and subsequently making it restart from the selected address.

Clearly the aforesaid instructions are only an example of implementation and they do not exhaust all the possibilities necessary to make the memory work as a sequential machine, but this set of instructions could already relieve the microprocessor from performing a quantity of tasks that in some applications can be very substantial.

What is claimed is:

1. A non-volatile semiconductor memory device comprising an address buffer block, a matrix of non-volatile memory cells, and an output buffer block, said address buffer block configured to receive input signals external to the memory device, that in a first operating mode are controlled by devices external to the memory device, and to transmit signals to said matrix of memory cells that are adapted to decode said received signals and to transmit in turn output decoded signals through said output buffer block, and further comprising a command block formed with the matrix of non-volatile memory cells, the command block comprising a command interpreter and an internal counter and no CPU and activatable through an external control signal that, once activated, puts the memory device in a second operating mode as a sequential machine to perform a predefined set of instructions stored in the matrix of memory cells in which said command block receives at least a part of said signals in output of said matrix of memory cells and, after having processed them, transmits internal address signals to said address buffer block, so to have a feedback inside said memory device to enable execution by the command block of a succession of limited only non-computational instructions stored in said matrix of memory cells autonomous of any CPU.

2. The device of claim 1, configured to receive an external clock signal for timing every internal time during the autonomous operation of said device.

3. The device of claim 1, wherein said command interpreter is configured to receive said output signals of said matrix of memory cells, is activatable through said external control signal, receives said input signals, and is coupled to said address buffer block.

4. The device of claim 3, wherein said internal counter is adapted to determine the addresses of said instructions in the matrix of memory cells.

5. The device of claim 4 wherein said command interpreter is coupled to said internal counter.

6. The device of claim 5, further comprising a latch circuit coupled between said matrix of memory cells and said output buffer block, the latch is adapted to transmit said output signals of said matrix of memory cells to said command interpreter.

7. The device of claim 1 wherein a direct connection is present between said address buffer block and said output buffer block, to enable use of said device as a device of extended I/O connection.

8. A non-volatile memory device, comprising a matrix of non-volatile memory cells coupled to a command circuit formed with the matrix of non-volatile memory cells, the command circuit comprising an internal counter and a command interpreter, and no CPU, that is configured to receive and process output signals from the matrix of non-volatile memory cells and to transmit address signals to the matrix of non-volatile memory cells in response to an external control signal, the matrix of non-volatile memory cells and the command circuit configured to operate only as a sequential machine to decode the address signals transmitted from the command circuit and execute a succession of only non-computational, predefined instructions stored therein autonomous of any CPU.

9. The device of claim 8, further comprising an input buffer circuit coupled to the memory matrix and configured to receive and decode address signals and transmit the decoded address signals to the matrix of memory cells, and an output buffer circuit coupled to the matrix of memory cells and to the command circuit.

10. The device of claim 9, further comprising latch circuits coupled between the matrix of memory cells and the output buffers, and further coupled to the command circuit, the latch circuits configured to store output signals from the matrix of memory cells and transmit output signals to the command circuit and the output buffers.

11. The device of claim 10 wherein the latch circuits are further configured to store an instruction in two or more cycles and to transmit the instruction in one cycle to the command circuit.

12. The device of claim 8 wherein the internal counter is configured to receive an external clock signal and to calculate the next instruction address.

13. The device of claim 9, further comprising a direct connection between the input buffer circuit and the output buffer circuit to enable use of the device as an extended input-output device.

14. A method for operation of a memory device as a sequential circuit, comprising:

receiving at a command circuit a part of output signals from a matrix of non-volatile memory cells in which the command circuit is formed;

processing the output signals in the command circuit that consists of a counter and a command interpreter, and no CPU, to form one or more address signals;

transmitting the one or more address signals to the matrix of non-volatile memory cells;

decoding the one or more address signals in the matrix of non-volatile memory cells;

to sequentially execute only a predefined set of non-computational instructions stored in the matrix of non-volatile memory cells.

15. The method of claim 14 wherein receiving output signals at the command circuit further comprises receiving input signals at the command circuit, the input signals including one or more external signals for activating the command circuit.

16. The method of claim 14 wherein processing the output signals in the command circuit further comprises receiving an external clock signal in the command circuit and calculating the address of the next instruction.

17. The method of claim 14 wherein receiving output signals comprises storing the output signals in a latch circuit in two or more clock cycles to form a combined output signal, and transmitting the combined output signal to the command circuit.

18. The method of claim 14 wherein receiving output signals further comprises receiving an input signal from an external device at an input buffer and transmitting the input signal from the input buffer directly to an output buffer to bypass the matrix of memory cells.

* * * * *